US006858539B2

United States Patent
Minamihaba et al.

(10) Patent No.: US 6,858,539 B2
(45) Date of Patent: Feb. 22, 2005

(54) POST-CMP TREATING LIQUID AND METHOD FOR MANUFACTURING SEMICONDUCTOR DEVICE

(75) Inventors: Gaku Minamihaba, Kawasaki (JP); Yukiteru Matsui, Yokohama (JP); Nobuyuki Kurashima, Yokohoma (JP); Hiroyuki Yano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 50 days.

(21) Appl. No.: 10/330,105

(22) Filed: Dec. 30, 2002

(65) Prior Publication Data
US 2004/0082180 A1 Apr. 29, 2004

(30) Foreign Application Priority Data

Oct. 24, 2002 (JP) ......................................... 2002-309608

(51) Int. Cl.[7] ............................................. H01L 21/302
(52) U.S. Cl. ..................... 438/692; 438/693; 438/697; 438/700
(58) Field of Search ................................ 438/692, 693, 438/697, 700

(56) References Cited

U.S. PATENT DOCUMENTS 6,165,052 A * 12/2000 Yu et al. ........................ 451/41
6,447,695 B1 * 9/2002 Motonari et al. ........... 252/79.1
6,582,761 B1 * 6/2003 Nishimoto et al. ......... 427/203
6,656,842 B2 * 12/2003 Li et al. ...................... 438/691

FOREIGN PATENT DOCUMENTS

| JP | 2001-269169 | 9/2000 |
| JP | 2001-15462  | 1/2001 |

* cited by examiner

Primary Examiner—Nadine G. Norton
Assistant Examiner—Binh X. Tran
(74) Attorney, Agent, or Firm—Oblon, Spivak, McClelland, Maier & Neustadt, P.C.

(57) ABSTRACT

There is disclosed a post-CMP treating liquid comprising water, and resin particles dispersed in the water and having a functional group at a surface thereof, or comprising water, resin particles dispersed in the water, and an additive having a functional group and incorporated in the water. The post-CMP treating liquid exhibits a polishing rate both of an insulating film and a conductive film of 10 nm/min or less.

9 Claims, 2 Drawing Sheets

POST-CMP TREATING LIQUID AND METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2002-309608, filed Oct. 24, 2002; the entire contents of which are incorporated herein by reference.

BACKGROUND OF THE INVENTION

1. Field of the Invention

The present invention relates to a treating liquid employed in the manufacture of a semiconductor device, and to a method for manufacturing a semiconductor device. In particular, the present invention relates to a treating liquid employed in the post-treatment for Chemical Mechanical Polishing (CMP), and to a method for manufacturing a semiconductor device using this treating liquid.

2. Description of the Related Art

In recent years, to meet the trend to further enhance the integration of LSI, the techniques to further refine the wirings are now being rapidly advanced in the manufacture of LSIs. Additionally, in order to alleviate the retardation of wiring RC, it is considered imperative to employ a novel material. Under the circumstances, it is now tried to employ Cu which is low in electric resistance ($\rho$: 1.8 $\mu\Omega$cm) as a conductive material, and to employ an insulating film having low relative dielectric constant (k: <2.5) as an electric insulating material.

Cu wirings (wirings made of Cu) are formed, in most cases, as damascene wirings by using a CMP technique. Since an electric conductive material located between wirings can be removed in polishing by a CMP, it is possible to obtain a wiring relatively free from short-circuits as compared with the wiring such as the conventional Al wirings formed by RIE.

After this CMP treatment, residual materials such as dust (residual polishing particles and residual shavings) and unreacted slurry unavoidably remain on the surfaces of the insulating film and of the wirings. These residual materials have been conventionally removed by using a washing liquid containing a chelate complex-forming agent and a surfactant. However, as the intervals between wirings are increasingly narrowed, it now becomes more difficult to employ this conventional method for coping with the removal of these residual materials.

Since the intervals of wirings required for the semiconductor device of the next generation will be 0.1 $\mu$m or less, a small quantity of such a very fine residual material that has been conventionally not considered to raise any substantial problem may become a cause for the generation of defective wirings, such as short-circuits between wirings, or deterioration in the withstand voltage of an insulating film.

Further, since most insulating films having a low relative dielectric constant contain an organic component, the surface of such insulating films is hydrophobic and hence poor in wettability to water. As a result, dust is easily adsorbed onto the surface of the insulating film during the CMP treatment or during the washing after the CMP treatment. Moreover, the dust thus adsorbed cannot be removed, which is one of the problems preventing wirings from being electrically isolated from each other. The insulating film having a low relative dielectric constant is also accompanied with a defect that scratches are more likely to be formed thereon.

BRIEF SUMMARY OF THE INVENTION

A post-CMP treating liquid according to one embodiment of the present invention comprises:

water; and resin particles dispersed in the water and having a functional group at a surface thereof, the treating liquid exhibiting a polishing rate both of an insulating film and a conductive film of 10 nm/min or less.

A post-CMP treating liquid according to another embodiment of the present invention comprises:

water;

resin particles dispersed in the water; and an additive having a functional group and incorporated in the water, the treating liquid exhibiting a polishing rate both of an insulating film and a conductive film of 10 nm/min or less.

A method for manufacturing a semiconductor device according to one embodiment of the present invention comprises:

forming an objective film to be treated above a semiconductor substrate;

subjecting the objective film to a polishing treatment to obtain a polished surface; and treating the polished surface by using a treating liquid comprising water incorporating resin particles in such a manner that the polished surface is not substantially polished.

DETAILED DESCRIPTION OF THE INVENTION

Figure 1A:
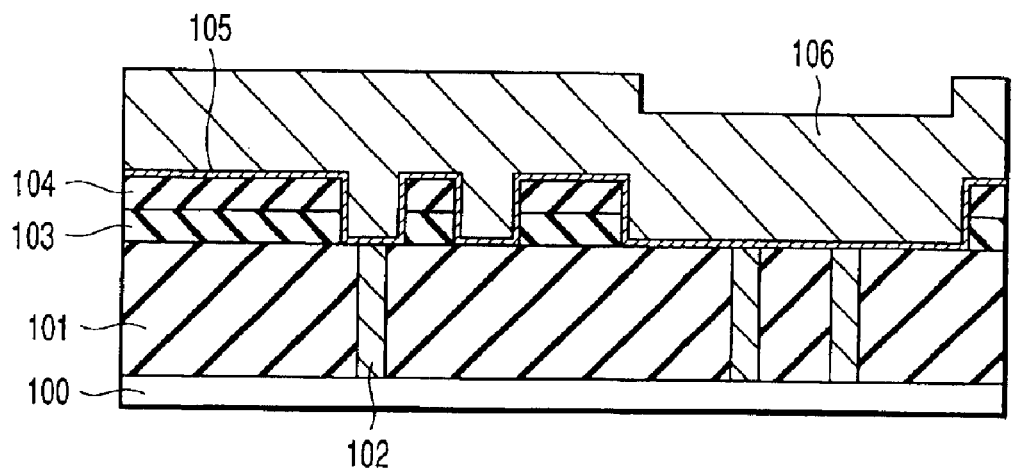
FIGS. 1A to 1C are cross-sectional views each illustrating the manufacturing method of a semiconductor device according to one embodiment of the present invention.

Next, embodiments according to the present invention will be explained in detail.

The present inventors have considered that the removal of dust remaining on the surface of the wiring layer immediately after CMP treatment has been achieved by the combined effect of four fundamental actions, i.e. dissolution, chemical action, mechanical action and surface activity. For example, a treating liquid containing a chelate complex-forming agent for providing chemical action, and a surfactant for effecting surface activity, both of these components being incorporated into pure water for dissolution, is employed and fed to the surface of a wiring layer while the surface of the wiring layer is being polished with a polishing cloth, thereby applying a mechanical effect on the residual dust.

On the other hand, it has been found by the present inventors that it is possible to remove residual materials, such as dust, from the surface of a fine wiring layer, by performing a sufficient mechanical action on the surface of the fine wiring layer even if actions such as chemical action and surface activity are not necessarily applied thereto. Namely, it has been found that the residual materials can be substantially completely removed by using the treating liquid according to one embodiment of the present invention in which the resin particles stably dispersed in water and applying a sufficient mechanical action on residual materials adhered to the surface of a fine wiring layer.

In the embodiments of the present invention, the main object thereof is to remove residual materials from the surfaces both of a wiring layer and an insulating film, so that they are not intended to polish the insulating film such as $SiO_2$ and the conductive film such as Cu, Ta, etc. Rather, an objective film to be treated, i.e. the insulating film and conductive film should not be polished by the treatment using the treating liquid according to the embodiments of the present invention. Therefore, the polishing rate of the insulating film and conductive film that may be achieved by the treatment with the treating liquid according to the embodiments of the present invention should be confined to 10 nm/min or less. If this polishing rate is 10 nm/min or less irrespective of the polishing conditions and of the kind of insulating film and conductive film, it may be deemed that the insulating film and conductive film are substantially not polished, thus achieving the effects of the embodiments of the present invention.

As for the resin particles, they may made from, for example, polymethylmethacrylate (PMMA), polystyrene, polyethylene, polyethylene glycol, polyvinyl acetate, polybutadiene, polyisobutylene, polypropylene and polyoxymethylene. The resin particles may be formed of a single material or may be formed of a combination of two or more materials.

When a polishing cloth is employed in the removal of the residual materials, the material for the polishing cloth may be unwoven fabric, sponge, a foamed material or non-foamed material. Any of these materials would be capable of providing the resin particles with a sufficient mechanical action so as to effectively remove the residual materials.

The resin particles as mentioned above are dispersed in pure water or deionized water to obtain a treating liquid according to the embodiments of the present invention. When the resin particles are accompanied by a functional group, it can be stably dispersed in water. Moreover, due to the effects of the functional group, the effect of surface activity would be provided to the resin particles, thus making it possible to enhance the washing effect of the resin particles. It is preferable, in order to promote the adsorption of the resin particles to the residual materials so as to further enhance the washing effect of the resin particles, to select the functional group whose electric potential in water is opposite to that of the residual materials.

As explained later, the washing effect of the treating liquid according to the embodiments of the present invention can be further enhanced by the addition of a chelate complex-forming agent or a surfactant. Since most of these additives are anionic, the surface of the resin particles should preferably be also made anionic in view of stabilizing the dispersion thereof in the treating liquid. Additionally, the anionic resin particles are advantageous as compared with cationic resin particle in that the safety thereof is higher, that the kind thereof is more plentiful, and that the cost thereof is cheaper. As for the specific functional group capable of generating anions (for example, $-COO^-$, $-SO_3^-$) in water, it includes a carboxyl group and sulfonyl group. Especially, a carboxyl group is more preferable. Incidentally, as for the functional group capable of generating cations (for example, $-NH_3^+$) in water, it includes an amino group.

When the functional group exist bonding to the surface of the resin particles for instance, the functional group is enabled to exhibit the function thereof even if the quantity of the functional group is very small. Alternatively, it is also possible to separately incorporate an additive having the functional group into the treating liquid. The additive having the functional group may be either anionic or cationic. Specific examples of an anionic additive are, for example, dodecylbenzene sulfonate or the salts thereof, alkyl phosphate or the salts thereof, dodecyl sulfonate or the salts thereof, and alkenyl succinate or the salts thereof. A specific example of a cationic additive is, for example, cetyl ammonium salt, etc. Further, it is also possible to employ a nonionic additive such as polyoxyethylene and alkyl ether. If these additives are separately added to the treating liquid, the content thereof should preferably be in the range of about 0.01 to 5 wt % based on the total weight of the treating liquid. If the content of these additives falls outside this range, it may be difficult to obtain the desired effects. Among these additives, dodecylbenzene sulfonate or the salts thereof are excellent in adsorbability to hydrophobic materials since an alkyl chain and benzene ring exist at the hydrophobic site of a dodecylbenzene sulfonate or the salts thereof. Moreover, because of the fact that sulfonic acid, which is excellent in affinity to water, exists at the hydrophilic site of dodecylbenzene sulfonate or the salts thereof, dodecylbenzene sulfonate or the salts thereof also function as a surfactant for enhancing the washing effect to wirings.

The primary particle diameter of the resin particles should preferably be confined to the range of 10 nm to 5,000 nm. If the primary particle diameter of the resin particle falls outside this range, it may become difficult to enable the resin particles to exhibit a sufficient mechanical effect. When a polishing cloth is employed, for example, since the surface roughness of a polishing cloth is within the range of about 5,000 to 20,000 nm, it is required, in order to remove adhered matters from the surface of a wiring, to apply a mechanical action by a fine textured wiping which is smaller in roughness than that of the surface of the polishing cloth. Even in the case where a washing member which is not perform conditioning is employed, as in the case of roll washing or pencil washing, the primary particle diameter of the resin particles should preferably be not more than 5,000 nm in order to realize an effective mechanical action.

Even if the quantity of the resin particle in the treating liquid is as small as 0.001 wt % based on the total quantity of the treating liquid, it is possible to realize the effect of removing the adhered matter. In order to cope with the semiconductor device of the next generation whose design rule of wiring is 0.1 $\mu$m or less, the concentration of the resin particle in the treating liquid should preferably be set to the range of 0.1 wt % to 20 wt %. When the concentration of the resin particle is 0.1 wt % or more, it becomes possible to turn a hydrophobic surface into a sufficiently hydrophilized surface, thereby making it possible to greatly enhance the washing effect of the treating liquid. Further, in order to stably disperse the resin particles in water so as to enable the resin particles to sufficiently exhibit the effects thereof, the upper limit of the concentration of resin particle should preferably be confined to 20 wt %.

If necessary, a chelate complex-forming agent as well as a surfactant may be added to the treating liquid comprising the resin particle and the functional group. It is possible, through the addition of these components, to further enhance the effects of removing the aforementioned adhered matters.

Specific examples of the chelate complex-forming agent are an organic acid such as oxalic acid, citric acid, malonic acid, tartaric acid, malic acid and lactic acid; ammonia; and a basic salt such as ethylene diamine. These chelate complex-forming agents may be incorporated into the treating liquid at a content of about 0.01 wt % to 1 wt % for instance. Specific examples of the surfactant are a polyacrylic acid, and polycarboxylic acid, etc., which can be incorporated into the treating liquid at a content of about 0.001 wt % to 1 wt % for instance.

For the practical use of the treating liquid, the treating liquid prepared as explained above is applied to the surfaces of a wiring layer and of an insulating film after the CMP treatment, and then, a mechanical action by using a member such as a polishing cloth, a roll or a pencil is further applied to the surfaces of a wiring layer and of an insulating film to remove residual material from the surface of a wiring layer and insulating film, thus obtaining a semiconductor device exhibiting excellent electric properties.

Next, one example where a Cu damascene wiring was formed by the method according to one embodiment of the present invention will be explained.

Figure 1B:
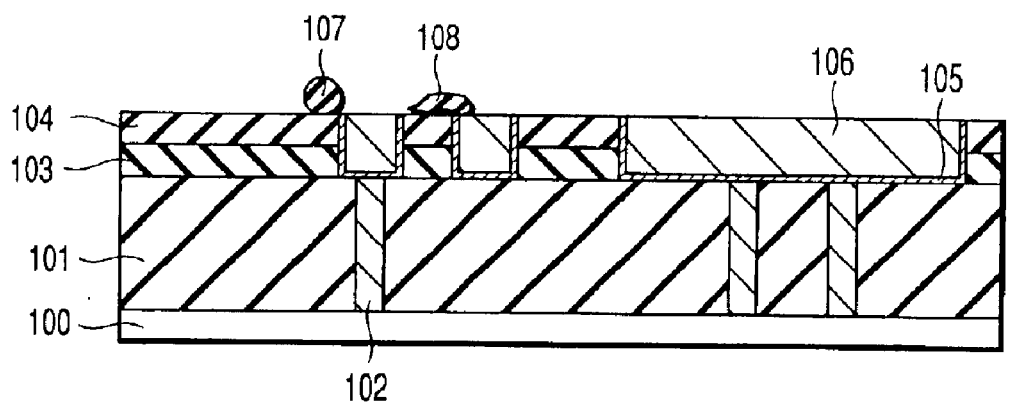
Figure 1C:
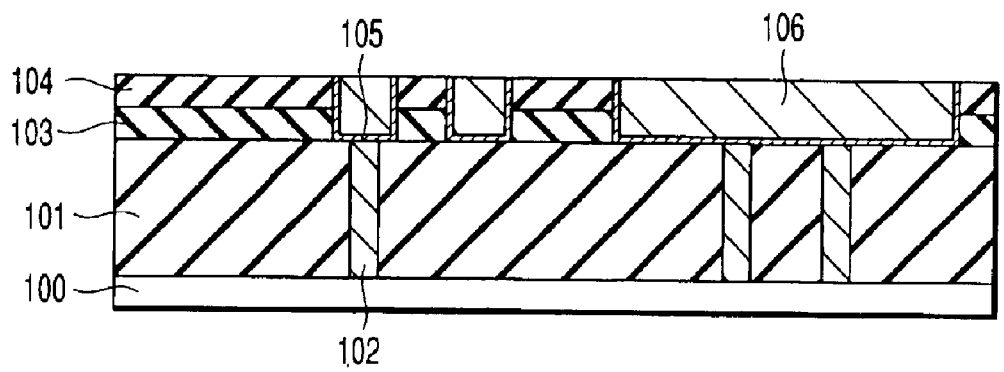

FIGS. 1A to 1C show cross-sectional views each illustrating the method according to one embodiment of the present invention.

First of all, as shown in FIG. 1A, a barrier metal film 105 and a wiring material film 106 are deposited on the surface of a semiconductor substrate 100 having semiconductor elements (not shown) formed thereon with an inorganic insulating film 101 and an insulating laminate films 103 and 104 being interposed therebetween.

In the inorganic insulating film 101, a plug 102 formed of tungsten (W) is buried. The laminate insulating film is constituted by a first insulating film 103 having a relative dielectric constant of less than 2.5, and a second insulating film 104 deposited on the first insulating film 103 and having a relative dielectric constant higher than that of the first insulating film 103. The thickness of each of first and second insulating films may be 100 nm.

The first insulating film 103 may be formed by using at least one selected from the group consisting of a film of a compound having a siloxane skeleton such as polysiloxane, hydrogensilsesquioxane, polymethylsiloxane, and methylsilsesquioxane; a film comprising mainly of an organic resin such as polyarylene ether, polybenzoxazole and polybenzocyclobutene; and a porous film such as a porous silica film. The first insulating film comprising these materials is fragile.

The second insulating film 104 deposited on the first insulating film 103 functions as a cap insulating film and may be formed by using at least one insulating film having a relative dielectric constant of 2.5 or more and selected from the group consisting, for example, of SiC, SiCH, SiCN, SiOC, SiN and SiOCH. The surface of the second insulating film 104 formed of these materials exhibits hydrophobicity. Incidentally, even an insulating film exhibiting hydrophilicity such as a film of SiO, SiOP, SiOF and SiON may be afflicted with the problem that residual matter adheres thereto after the CMP treatment. The treating liquid according to the embodiments of the present invention can be also suitably employed for treating these insulating films.

The barrier metal film 105 and the wiring material film 106 are deposited the entire surface of the laminate insulating film after wiring grooves are formed in the aforementioned laminate insulating film. The barrier metal film 105 may be constituted by a Ta film having a thickness of 10 nm, and the wiring material film 106 may be constituted by a Cu film having a thickness of 400 nm.

Incidentally, in the embodiment shown in FIG. 1A, the insulating film on which the barrier metal film 105 and the wiring material film 106 is formed, is a laminate structure comprising the first insulating film 103 and the second insulating film 104. However, this insulating film may be formed of a single layer of insulating film. The insulating film in this case can be formed by using black diamond (Applied Materials Co., Ltd.) for instance. The surface of the second insulating film 104 formed of these materials is also exhibits hydrophobicity.

Next, the superfluous portions of the barrier metal film 105 and the wiring material film 106 were removed by CMP to expose the surface of the second insulating film 104 as shown in FIG. 1B. This CMP was performed in two steps, i.e. the removal of the wiring material film 106 (1st polishing), and the removal of the barrier metal film 105 (2nd polishing). The conditions for this CMP were as follows.

(1st Polishing)
Slurry: CMS7303/7304 (JSR Co., Ltd.)
Feeding rate of slurry: 250 cc/min;
Polishing pad: IC1000 (tradename; Rodel Nitta Co., Ltd.);
Load (DF): 300 gf/cm$^2$.

The number of rotation of the carrier and the turntable was both set to 100 rpm, and the polishing was continued for one minute.

(2nd Polishing)
Slurry: CMS8301 (JSR Co., Ltd.)
Feeding rate of slurry: 200 cc/min;
Polishing pad: IC1000 (tradename; Rodel Nitta Co., Ltd.);
Load (DF): 300 gf/cm$^2$.

The number of rotation of the carrier and the turntable was both set to 100 rpm, and the polishing was continued for 30 seconds.

As shown in FIG. 1B, residual matter, such as polishing particle 107 and polish-product material 108 may adhere on the surfaces of the second insulating film 104, of the barrier metal film 105 and of the wiring material film 106 immediately after the second polishing.

These adhered materials are removed by washing using the treating liquid according to the embodiments of the present invention to obtain a clean surface as shown in FIG. 1C.

The treating liquids according to the embodiments of the present invention were prepared by the following procedures.

EXAMPLE 1

PMMA particles having a carboxyl group on the surface thereof (primary particle diameter: 10 nm) were prepared as the resin particles and then, dispersed in pure water at a concentration of 0.001 wt % to prepare the treating liquid of Example 1.

EXAMPLES 2–6

Various kinds of treating liquid were prepared in the same manner as in Example 1 except that the concentration of the resin particles was modified to 0.01 wt %, 0.1 wt %, 1 wt %, 5 wt % and 20 wt %.

EXAMPLE 7

Polystyrene particles having a carboxyl group on the surface thereof (primary particle diameter: 10 nm) were prepared as the resin particles and then, dispersed in pure water at a concentration of 0.1 wt % to prepare the treating liquid of Example 7.

EXAMPLE 8

Two kinds of resin particles, i.e. polystyrene particle having a carboxyl group on the surface thereof (primary particle diameter: 10 nm), and PMMA particles having a carboxyl group on the surface thereof (primary particle diameter: 10 nm) were prepared and then, dispersed respectively in pure water to prepare the treating liquid of Example 8. Both of two resin particles are dispersed in pure water at a concentration of 0.05 wt %.

EXAMPLE 9

PMMA particles having a carboxyl group on the surface thereof (primary particle diameter: 100 nm) were prepared as a resin particles and then, dispersed in pure water at a concentration of 0.1 wt % to prepare the treating liquid of Example 9.

EXAMPLES 10 AND 11

Two kinds of treating liquid were prepared in the same manner as in Example 9 except that the primary particle diameter of the resin particles was modified to 1000 nm and 5000 nm, respectively.

EXAMPLE 12

Potassium dodecylbenzene sulfonate was employed as an additive having a functional group and dissolved in pure water at a concentration of 0.1 wt %, and then, PMMA particles (primary particle diameter: 10 nm) as the resin particles were also dispersed in the aforementioned pure water at a concentration of 0.1 wt % to prepare the treating liquid of Example 12. In the treating liquid of this example, the functional group was not bonded to the surface of the resin particles but was available from the dodecylbenzene sulfonate.

EXAMPLE 13

Oxalic acid was employed as an organic acid (chelate complex-forming agent) and added, at a concentration of 0.2 wt %, to a treating liquid having the same composition as that of Example 3 to prepare the treating liquid of Example 13.

EXAMPLE 14

Citric acid was employed as an organic acid (chelate complex-forming agent) and added, at a concentration of 0.2 swt %, to a treating liquid having the same composition as that of Example 3 to prepare the treating liquid of Example 14.

EXAMPLE 15

Polyacrylic acid was employed as a surfactant and added, at a concentration of 0.05 wt %, to a treating liquid having the same composition as that of Example 14 to prepare the treating liquid of Example 15.

EXAMPLE 16

Polystyrene particles having a sulfonyl group on the surface thereof (primary particle diameter: 10 nm) were prepared as the resin particles and then, dispersed in pure water at a concentration of 0.1 wt % to prepare the treating liquid of Example 16.

EXAMPLE 17

Polystyrene particles having an amino group on the surface thereof (primary particle diameter: 10 nm) were prepared as the resin particles and then, dispersed in pure water at a concentration of 0.1 wt % to prepare the treating liquid of Example 17.

EXAMPLE 18

Alkenyl succinate was employed as an additive having a functional group and dissolved in pure water at a concentration of 0.1 wt %, and then, PMMA particles (primary particle diameter: 10 nm) as the resin particles were also dispersed in the aforementioned pure water at a concentration of 0.1 wt % to prepare the treating liquid of Example 18. In the treating liquid of this example, a carboxyl group as the functional group was not bonded to the surface of the resin particle but was available from the alkenyl succinate.

EXAMPLE 19

Ammonium chloride was employed as an additive having a functional group and dissolved in pure water at a concentration of 0.1 wt %, and then, PMMA particles (primary particle diameter: 10 nm) as the resin particles were also dispersed in the aforementioned pure water at a concentration of 0.1 wt % to prepare the treating liquid of Example 19. In the treating liquid of this example, an amino group as the functional group was not bonded to the surface of the resin particle but was available from the ammonium chloride.

By using the treating liquids prepared in Examples 1 to 19, the surface constructed as shown in FIG. 1B was washed. This washing was performed while the treating liquid was supplied to the polishing cloth (Rodel Nitta Co., Ltd.) having a surface roughness of about 10,000 nm with the polishing cloth being kept contacted with the treating surface for about 15 to 60 seconds so as to wipe the treating surface with the polishing cloth under the following conditions. In this case, the treating surface is constituted by the surface of the second insulating film 104 and of the wiring material film 106.

Flow rate of washing liquid: 300 cc/min;

Load: 300 gf/cm$^2$.

The number of rotations of the carrier and the turntable was both set to 100 rpm.

Since it becomes difficult to remove residual materials once the treating surface is dried out, the washing should preferably be performed while the treating surface is in a wet state. Namely, the washing should preferably be continuously performed after finishing the second polishing and by using the same apparatus.

Incidentally, instead of the washing using a polishing cloth, it is also possible to employ roll washing or pencil washing.

The surface constructed as shown in FIG. 1B was washed in the same manner as described above except that the following treating liquids were employed, which were defined as Comparative Examples 1 to 3.

Comparative Example 1
pure water.

Comparative Example 2
pure water containing oxalic acid (0.2 wt %).

Comparative Example 3
pure water containing oxalic acid (0.2 wt %) and polyacrylic acid (0.05 wt %).

Incidentally, Comparative Example 3 corresponds to the conventional treating liquid.

After the washing treatment, the wirings (line/space: 0.08 μm/0.08 μm) obtained were investigated with respect to the yield regarding the short-circuit of wirings and the I-V characteristics of the insulating film were measured based on the values of leak current (applied electric field: 1 MV/cm), the results being summarized in the following Table 1.

TABLE 1

|  | Yield regarding the short-circuit of the wirings (%) | Leak current (nA) |
|---|---|---|
| Example 1 | 90 | 11 |
| Example 2 | 96 | 2 |
| Example 3 | 96 | 3 |
| Example 4 | 97 | 4 |
| Example 5 | 97 | 4 |
| Example 6 | 96 | 2 |
| Example 7 | 96 | 4 |
| Example 8 | 97 | 3 |
| Example 9 | 97 | 5 |
| Example 10 | 96 | 7 |
| Example 11 | 95 | 8 |
| Example 12 | 96 | 3 |
| Example 13 | 99 | 0.5 |
| Example 14 | 100 | 0.4 |
| Example 15 | 100 | 0.2 |
| Example 16 | 97 | 2 |
| Example 17 | 96 | 2 |
| Example 18 | 97 | 2 |
| Example 19 | 97 | 2 |
| Comp. Example 1 | 65 | 6548 |
| Comp. Example 2 | 72 | 873 |
| Comp. Example 3 | 75 | 664 |

As shown in Table 1, by washing the treating surface with a treating liquid containing the resin particle and the functional group (Examples 1 to 19), the electric characteristics of the semiconductor devices obtained were improved. More specifically, the yield regarding the short-circuit of wiring was increased to 90% or more, and the leak current was minimized to 11 nA or less. Incidentally, in all of these Examples, the polishing rate of the wiring material film 106 was about 1.5 nm/min, and the polishing rate of the second insulating film 104 was about 1 nm/min.

It was assumed from these results that the treating liquids containing the resin particles were capable of applying a mechanical action to the hydrophobic insulating film that was fragile and low in relative dielectric constant without imposing an excessive load on the insulating film, thereby making it possible, without causing the generation of scratches, to effectively remove the dust and residual matter that may give rise to the deterioration of electric characteristics of the semiconductor devices.

Incidentally, in the case of the semiconductor device of the next generation where the design rule is 0.1 μm, it is required that the yield regarding the short-circuit of wiring is 95% or more, and the leak current is confined to less than 10 nA. It is now possible, through the employment of the treating liquid containing resin particles at a concentration of 0.01 wt % or more (Examples 2 to 19), to cope with the design rule of the next generation.

By contrast, in the Comparative Examples where the treating liquid containing no resin particles, the yield regarding the short-circuit of wiring was at most 75%, and the leak current was as high as 6500 mA. Namely, it was assumed that since dust and the like could not be completely removed, it was only possible to achieve such a low performance.

Although the embodiments of the present invention have been explained taking the treatment after a Cu-CMP treatment as an example, the present invention is not limited to such embodiments. Namely, the treating liquid containing resin particles according to the present invention is also applicable to the formation of buried electrodes, wirings and plugs where Al, W and polysilicone are employed, to obtain almost the same effects as explained above. Further, the treating liquid of the embodiment of the present invention is also useful for the post treatment performed after the CMP treatment of a $SiO_2$ layer employed as an insulating film deposited on the surface of wirings, so that it is possible, through the employment of the treating liquid of the embodiment of the present invention, to effectively perform the washing of the $SiO_2$ layer to obtain a clean surface.

Furthermore, the treatment by using the treating liquid according to the embodiments of the present invention is also applicable to the formation of STI (Shallow Trench Isolation).

The procedures for the formation of this STI will be explained with reference to FIGS. 2A to 2C.

Figure 2A:
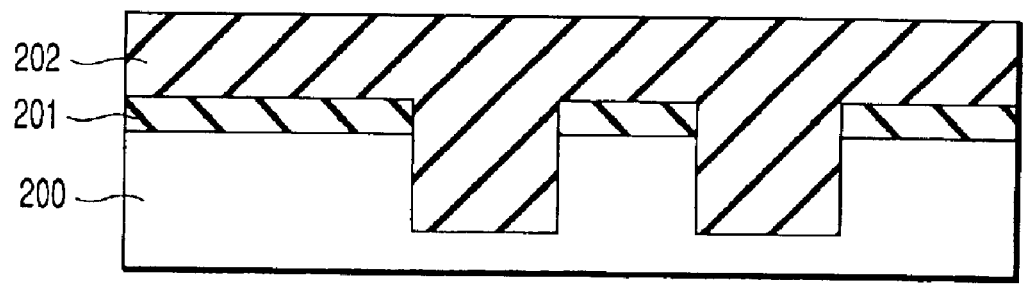
FIGS. 2A to 2C are cross-sectional views each illustrating the manufacturing method of semiconductor device according to another embodiment of the present invention.

First of all, as shown in FIG. 2A, a groove is formed in a semiconductor substrate 200 having a CMP stopper film 201 formed thereon, and then, an insulating film 202 is deposited the entire resultant substrate. In this case, SiN can be employed as the CMP stopper film 201. As for the insulating film 202, it is possible to employ a $SiO_2$ film which can be formed by HDP (High Density Plasma) method. Alternatively, carbon (C) can be also employed as the CMP stopper film 201, and a coat type insulating film such as an organic SOG can be also employed as the insulating film 202.

Figure 2B:
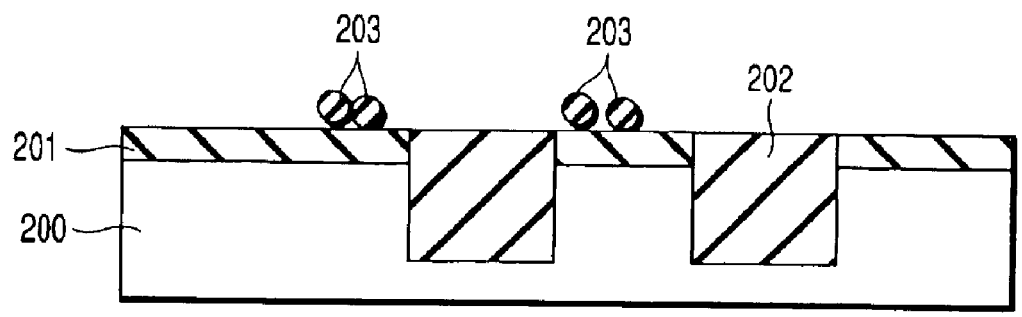

Next, a superfluous portion of the insulating film 202 is removed by CMP to expose the surface of the CMP stopper film 201 as shown in FIG. 2B. The conditions for this CMP were as follows.

Slurry: 0.5 wt % ceria particle

+0.01 wt % polyacrylic acid

+pure water (pH: 6);

Flow rate of slurry: 300 cc/min;

Polishing pad: IC1000 (tradename; Rodel Nitta Co., Ltd.);

Load (DF): 300 gf/cm$^2$.

The number of rotations of the carrier and the turntable was both set to 100 rpm, and the polishing was continued for one minute.

C and SiN used as a material for the CMP stopper film 201 are hydrophobic in most cases and the ζ potential thereof is considered to be isoelectric point. Therefore, polishing particles 203 may be adhere to the CMP stopper film 201 immediately after the polishing as shown in FIG. 2B.

Figure 2C:
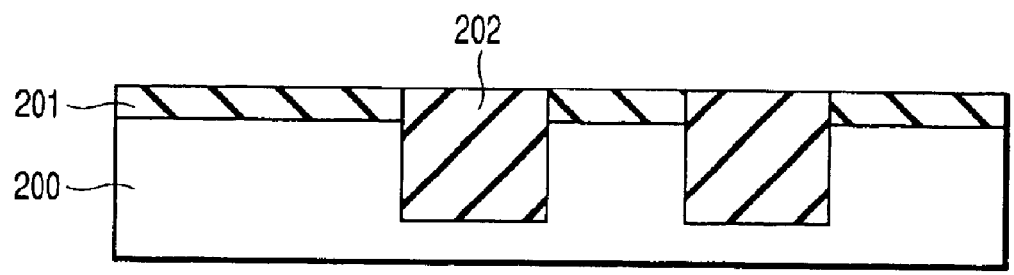

These adhered matters can be washed out and removed by using the treating liquid according the embodiments of the present invention, thus obtaining a clean surface as shown in FIG. 2C.

The treating liquid according to this embodiment of the present invention was prepared by the procedures as described below.

EXAMPLE 20

PMMA particles having an amino group on the surface thereof (primary particle diameter: 50 nm) were prepared as the resin particles and then, dispersed in pure water at a concentration of 0.05 wt %, and polyacrylic acid was also added as a surfactant to the pure water at a concentration of 0.05 wt % to prepare the treating liquid of Example 20.

By using the treating liquid prepared in Example 20, the surface constructed as shown in FIG. 2B was washed. This washing was performed for 60 seconds by using a roll (Ebara Co., Ltd.) and by feeding the treating liquid to the surface of the roll at a flow rate of 1000 cc/min while rotating the roll at a rotational speed of 100 rpm. Thereafter, the resultant surface was further washed for 60 seconds by feeing pure water at a flow rate of 1000 cc/min while rotating the roll at a rotational speed of 100 rpm. As explained above, the washing treatment should preferably be performed against the wet surface obtained immediately after finishing the polishing.

Additionally, the surface constructed as shown in FIG. 2B was washed in the same manner as described above except that pure water containing polyacrylic acid (0.05 wt %) was employed, which was defined as Comparative Example 4.

After these washing treatments, the residual polishing particles that may be adsorbed onto the surface of the CMP stopper film 201 were examined by using a defect-evaluation apparatus (KLA Tencol Co., Ltd.). As a result, in the case of Comparative Example 4, the number of the residual polishing particles adhered to the washed surface was found $1000/cm^2$ or more. Whereas, in the case of Example 20, there was no residual polishing particles. It was confirmed from these results that the residual polishing particles adhered onto the surface of the CMP stopper film 201 after the polishing were substantially completely removed from the surface of the CMP stopper film 201 by the washing using the treating liquid of this embodiment of the present invention.

Incidentally, the polishing rate of the insulating film 202 by the treating liquid of Example 20 was about 1 nm/min, and the polishing rate of the CMP stopper film 201 was about 0.5 nm/min.

The treating liquid according to the embodiments of the present invention is also applicable to washing treatments other than the post-treatment after the CMP treatment. For example, the treating liquid additionally containing an organic acid is also applicable to the removal of dust from an insulating film formed by plasma CVD, or to the removal of heavy metals remaining on the surface of silicon substrate, thereby making it possible to obtain a clean surface.

As explained above, it is possible, according to the embodiments of the present invention, to provide a post-CMP treating liquid, which is capable of effectively removing residual matters adhered to the surfaces of wiring layer or of insulating film. There is also provided, according to the embodiments of the present invention, a method for manufacturing a semiconductor device where the aforementioned post-CMP treating liquid is employed.

Since it is also possible, according to the present invention, to manufacture a semiconductor device having wirings 0.1 μm in design rule, thus exhibiting a high performance and a high processing speed, the present invention is very valuable from an industrial viewpoint.

Additional advantages and modifications will readily occur to those skilled in the art. Therefore, the invention is its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device comprising:

forming an insulating film above a semiconductor substrate;

forming a groove in the insulating film;

depositing a conductive film comprising a barrier metal film and a wiring material film on the insulating film;

subjecting said conductive film to a polishing treatment to expose the insulating film while selectively leaving the conductive film in the groove, thereby obtaining a polished surface, the polished surface including the insulating film, the barrier metal film and the wiring material film; and treating said polished surface by using a treating liquid comprising water incorporating resin particles, wherein a polishing rate of each of the insulating film, the barrier metal film and the wiring material film by the treating liquid being 10 nm/mm or less.

2. The method according to claim 1, wherein said insulating film is formed by forming a first insulating film having a relative dielectric constant of less than 2.5, and forming a second insulating film on the first insulating film, said second insulating film having a relative dielectric constant higher than that of said first insulating film.

3. The method according to claim 1, wherein the resin particles comprises at least one selected from the group consisting of polymethylmethacrylate, polystyrene, polyethylene, polyethylene glycol, polyvinyl acetate, polybutadiene, polyisobutylene, polypropylene and polyoxymethylene.

4. The method according to claim 1, wherein the primary particle diameter of said resin particles in said treating liquid is in the range of 10 nm to 5000 nm.

5. The method according to claim 1, wherein a concentration of said resin particles in said treating liquid is in the range of 0.01 wt % to 20 wt %.

6. The method according to claim 1, wherein said resin particles have a functional group on the surface thereof.

7. The method according to claim 6, wherein the functional group comprises at least one selected from the group consisting of a carboxyl group, an amino group and a sulfonyl group.

8. The method according to claim 1, wherein the treating liquid comprises an additive having a functional group.

9. The method according to claim 8, wherein the functional group comprises at least one selected from the group consisting of a carboxyl group, an amino group and a sulfonyl group.

* * * * *